(12) United States Patent
Tsai et al.

(10) Patent No.: US 7,123,043 B2
(45) Date of Patent: Oct. 17, 2006

(54) METHOD AND APPARATUS FOR TESTING DRIVER CIRCUITS OF AMOLED

(75) Inventors: Shan-Hung Tsai, Taichung (TW); Ming-Hsien Sun, Taipei (TW); An Shih, Changhua (TW)

(73) Assignee: TPO Displays Corp., Miao-Li (TW)

( * ) Notice: Subject to any disclaimer, the term of this patent is extended or adjusted under 35 U.S.C. 154(b) by 31 days.

(21) Appl. No.: 10/822,750

(22) Filed: Apr. 13, 2004

(65) Prior Publication Data

US 2004/0201372 A1    Oct. 14, 2004

(30) Foreign Application Priority Data

Apr. 14, 2003 (TW) .............................. 92108518 A

(51) Int. Cl.
*G01R 31/00* (2006.01)

(52) U.S. Cl. .................................................. 324/770
(58) Field of Classification Search ............... 324/767, 324/768, 769, 770
See application file for complete search history.

(56) References Cited

U.S. PATENT DOCUMENTS

| 5,047,713 A * | 9/1991 | Kirino et al. ............... 324/752 |
| 5,740,272 A * | 4/1998 | Shimada ..................... 382/149 |
| 6,946,307 B1 * | 9/2005 | Shih ............................ 438/17 |
| 2004/0189559 A1 * | 9/2004 | Shih ............................ 345/84 |

\* cited by examiner

*Primary Examiner*—Paresh Patel
*Assistant Examiner*—Roberto Velez
(74) *Attorney, Agent, or Firm*—Michael Bednarek; Pillsbury Winthrop Shaw Pittman LLP

(57) ABSTRACT

A method and an apparatus for testing a plurality of driver circuits of an AMOLED before OLEDs are implanted are provided. The method and the apparatus select one specific driver circuit to be tested and dispose a conductive board above the array glass of the OLED to form a capacitor. By using the data line, the scan line, and the power line of an AMOLED, the present invention is able to input and retrieve signals from driver circuits for analyzing each of them is normal or not.

5 Claims, 6 Drawing Sheets

METHOD AND APPARATUS FOR TESTING DRIVER CIRCUITS OF AMOLED

This Application claims priority to Taiwan Patent Application No. 092108518 filed on Apr. 14, 2003.

FIELD OF THE INVENTION

The present invention provides a method and an apparatus for testing driver circuits of an active matrix organic light emitting display (AMOLED) prior to implantation of organic light emitting diodes (OLEDs).

BACKGROUND OF THE INVENTION

As technology progresses, the manufacturing technique of monitor display is also progressing. Following the technique of light emitting diodes (LEDs), the newest technique of monitor display brought to the market is one that utilizes organic light emitting diodes (OLEDs). Each OLED requires a driver circuit to drive it for emitting light. The light can be of either a single color, such as red, green, blue, or full colors. The advantages of OLEDs are the flexibility, liberation from viewing angle restriction, long product lifetime and low power consumption. Accordingly, OLEDs are very likely to replace LEDs and become the most popular monitor display in the next generation.

Each pixel of an AMOLED needs an OLED and a driver circuit so there are ten thousands or even millions of driver circuits in one panel. It is a complicated task to conclude the functionality of all driver circuits in one panel. FIG. 1 shows one common driver circuit configured to drive an OLED of a monitor display. Referring to FIG. 1, the method of prior art for testing the driver circuit starts with enabling it via the scan line SL and inputting a certain voltage level via the data line DL after an OLED D1 is implanted. The driver circuit then transfers the voltage level into a current signal I which makes the OLED D1 emit light. According to the voltage level, test engineers determine the D1's functionality by subjectively observing its luminosity with eyes. If there is a failure in the tested driver circuit, the OLED D1 having been implanted in it is wasted and cannot be recovered even though the OLED D1 itself is still good. Accordingly, this test method of prior art would result in not only imprecision caused by the test engineers' subjective decision but also high costs.

SUMMARY OF THE INVENTION

The present invention provides a method and an apparatus to test the driver circuits of an AMOLED prior to implantation of OLEDs. The AMOLED includes a scan line, a data line, a power line and an array glass. Each driver circuit includes a first transistor, a second transistor and a first capacitor.

The method of the present invention includes the following steps: repeating the following steps until all signals for test outputted from the driver circuits of the AMOLED are retrieved, selecting a target driver circuit by enabling it via the scan line, charging the first capacitor and retrieving a first signal from the data line when the first capacitor is discharged via the first transistor, disposing a conductive board above the array glass to form a second capacitor between the conductive board and the array glass, and charging the second capacitor and retrieving a second signal from the power line when the second capacitor is discharged via the second transistor.

After storing all of the first and second signals, which are the signals for test mentioned above, one can derive an average value of the first signals and an average value of the second signals. By comparing the first and second signals of every driver circuit with the two average values, one can analyze whether the first and second signals fall within a normal range defined according to the average values to determine the functionality of the driver circuit.

The apparatus of the present invention includes a pixel selection device, a signal extractor and a signal analyzer. The pixel selection device is configured to input a signal for selecting a target driver circuit for test. The signal extractor is configured to retrieve the first and second signals of the target driver circuit. The signal analyzer, connected to the signal extractor, is configured to store and analyze the first and second signals in order to determine the functionality of the target driver circuit.

DETAILED DESCRIPTION

The present invention provides a method for testing driver circuits of an AMOLED prior to implantation of OLEDs. The AMOLED has a plurality of driver circuits used to drive a plurality of OLEDs. The AMOLED further includes a scan line, a data line, a power line and an array glass. The scan line is configured to transmit a signal to every driver circuit in order to enable or disable it. The data line is configured to transmit another signal to driver circuits to dive OLEDs to emit light after the OLEDs are implanted. The power line is configured to provide power for all driver circuits. The array glass, a semiconductor plane, is configured to carry the driver circuits.

Figure 1:
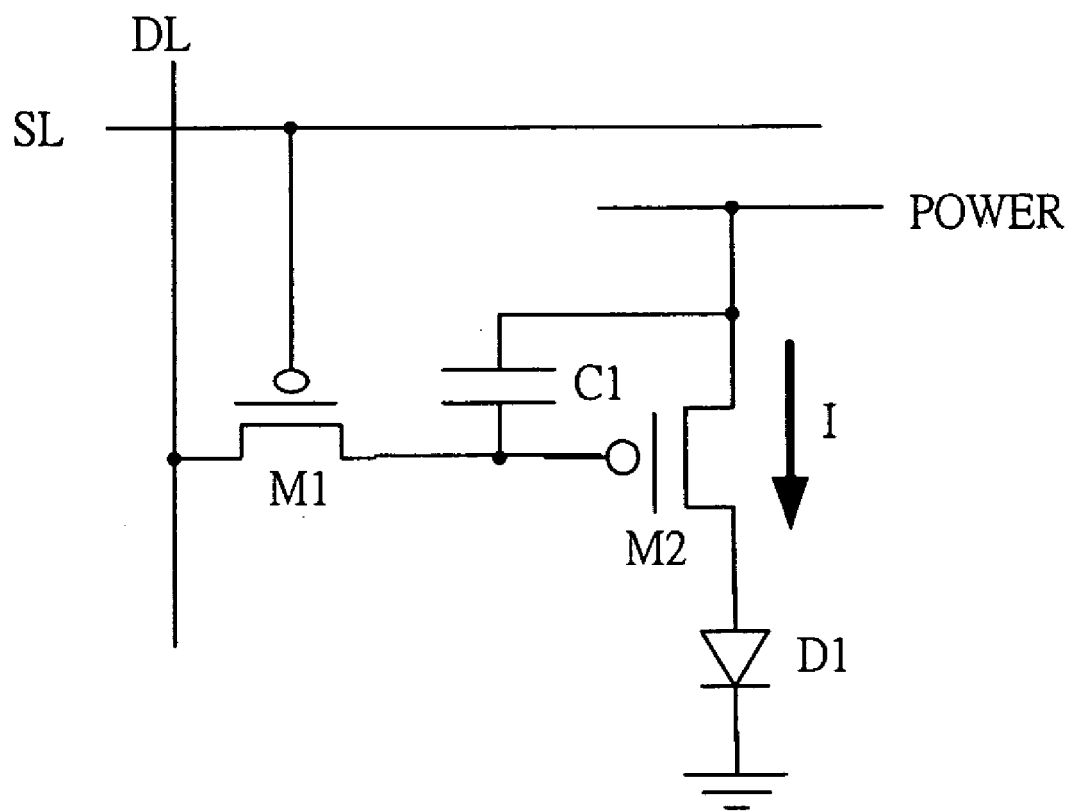
FIG. 1 illustrates one driver circuitry for test of the prior art.
Figure 2:
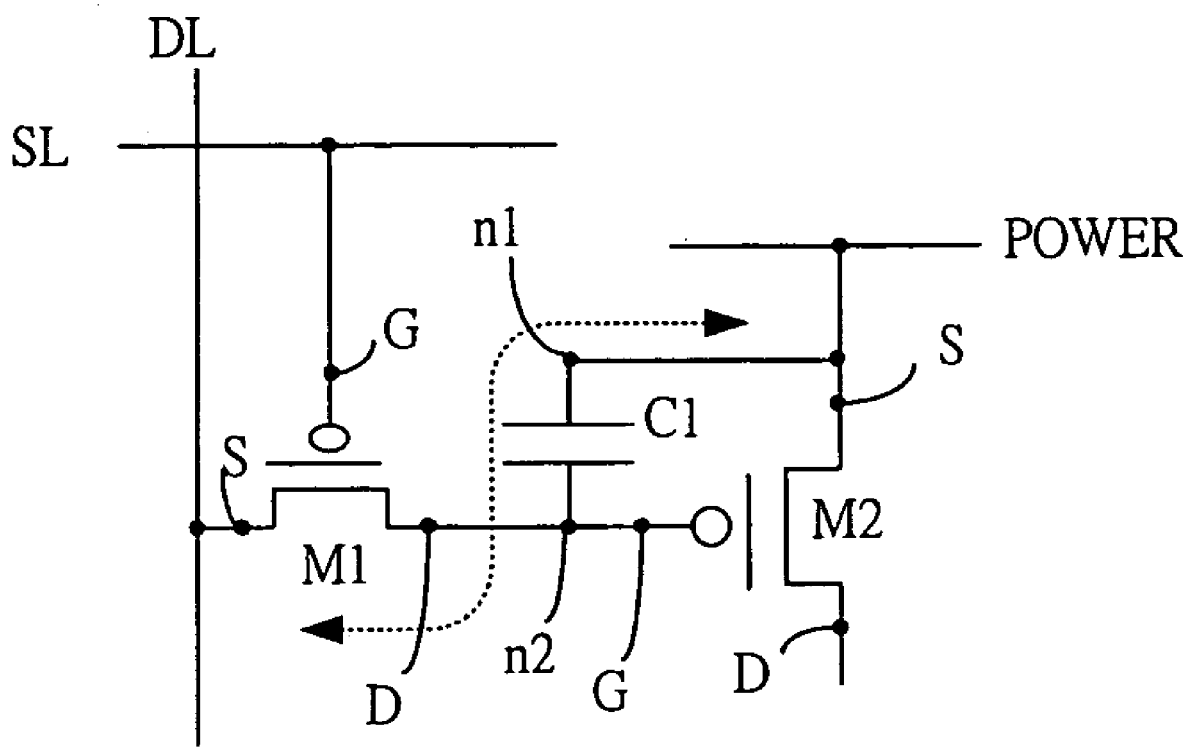
FIG. 2 illustrates the circuitry for retrieving a first signal by the method of the present invention.

FIG. 2 shows one of the common driver circuits on which an OLED is not yet implanted. With reference to the embodiment shown in FIG. 2, a driver circuit includes a first transistor M1, a second transistor M2 and a first capacitor C1. The first transistor M1 and the second transistor M2 respectively include a source S, a gate G and a drain D. The first capacitor C1 includes a first end n1 and a second end n2. The source S, or the drain D, of the first transistor M1 is connected to the data line DL of the AMOLED. The gate G of the first transistor M1 is connected to the scan line SL of the AMOLED. The first end n1 of the first capacitor C1 and the power line POWER are together connected to the source S, or the drain D, of the second transistor M2. The second end n2 of the first capacitor C1 is connected to the gate G of the second transistor M2. The drain D, or the source S, of the second transistor M2 is connected to the array glass of the AMOLED (not shown) and, after implantation of an OLED, will be connected to the OLED.

Figure 3:
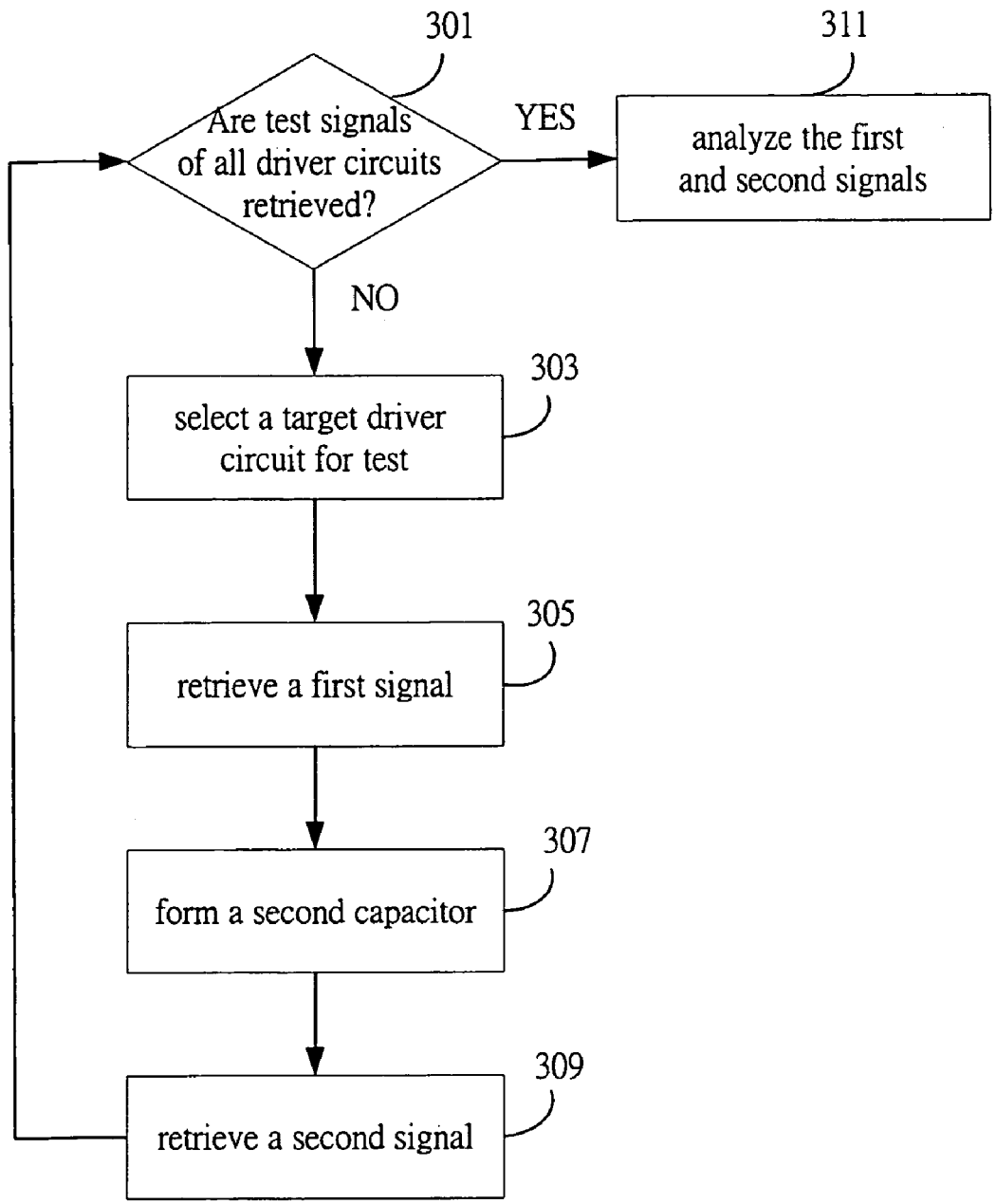
FIG. 3 illustrates the flow chart of the method provided by the present invention.

To specify the method of the present invention, it is recommended referring to FIG. 3, which shows the steps of the method. In step 301, checking whether test signals of all driver circuits of the AMOLED have been retrieved. If not, execute step 303, in which a target driver circuit that is not tested yet is selected by inputting a voltage signal to the scan line SL. Taking the driver circuit shown in FIG. 2 as an example, because the first transistor M1 is a p-channel TFT, in step 303, a low voltage level is transmitted through the scan line SL to the gate G of the first transistor M1 so as to turn on the first transistor M1. In step 305, as the dotted line in FIG. 2 shows, the first capacitor C1 is charged and then a first signal is retrieved from the data line DL when the first capacitor C1 is discharged via the first transistor M1.

When the first capacitor C1 is charged, a voltage signal is provided onto the data line DL, which is high enough to make the voltage level on the power line POWER comparatively low, so an electrical loop can be generated (the data line DL→the first transistor M1→the first capacitor C1→the power line POWER). Since the first transistor M1 has been already turned on in step 303, there is a current flowing through the first transistor M1 to charge the first capacitor C1. After an appropriate time period when the first capacitor C1 is fully charged, the voltage level on the data line DL switches low so that the voltage level on the power line POWER becomes comparatively high to generate an opposite electrical loop (the power line POWER→the first capacitor C1→the first transistor M1→the data line DL). Then the first capacitor C1 can discharge toward the data line DL via the first transistor M1. Hence, one can retrieve the first signal of the target driver circuit resulted from the discharge of the first capacitor C1 during the discharge period.

Figure 4:
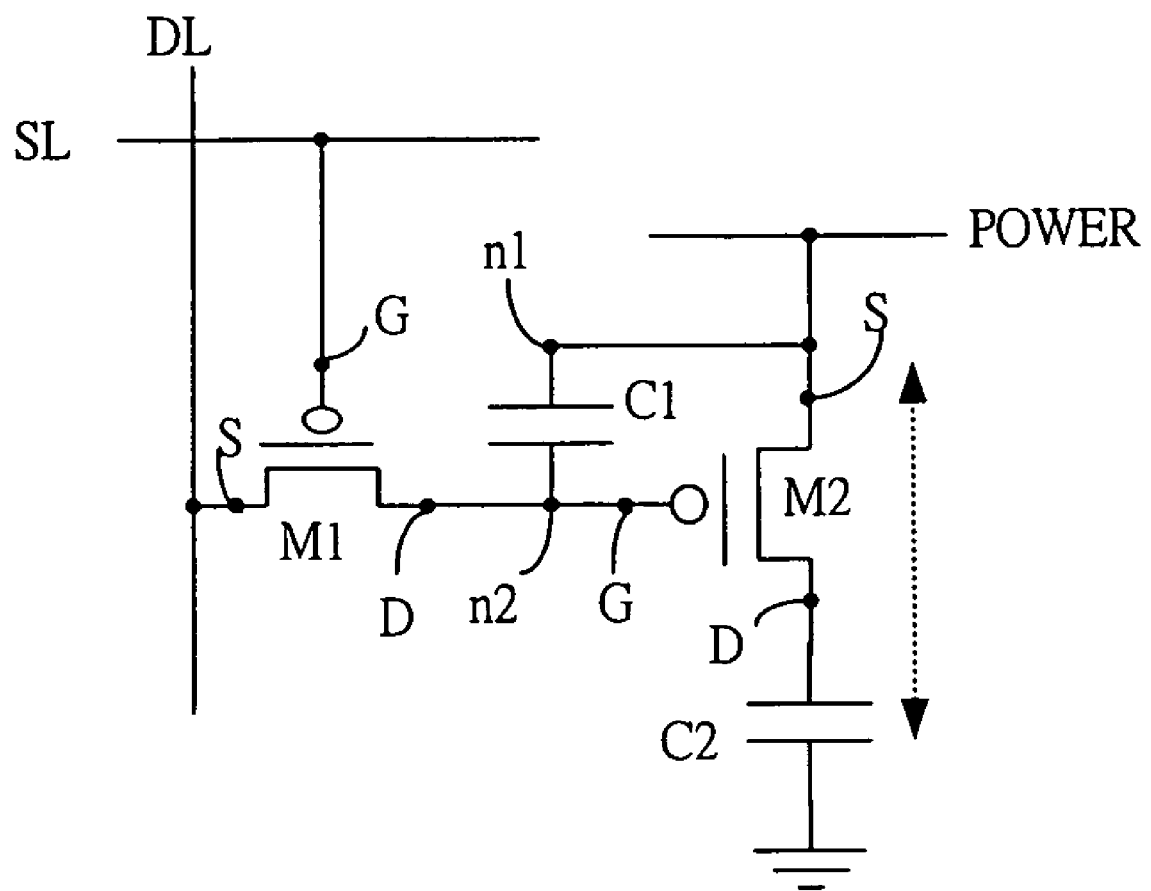
FIG. 4 illustrates the circuitry for retrieving a second signal by the method of the present invention.

In step 307, a conductive board is disposed above the array glass and preferably tied to ground, forming a parallel plane capacitor between the array glass and the conductive board designated as a second capacitor C2 shown in FIG. 4. In step 309, as the dotted line shows, the second capacitor C2 is charged and a second signal is retrieved from the power line POWER when the second capacitor C2 is discharged via the second transistor M2.

To charge the second capacitor C2, a high voltage level is assigned onto the power line POWER to form an electrical loop (the power line POWER→the second transistor M2→the second capacitor C2→ground). A current, therefore, will charge the second capacitor C2 via the second transistor M2. After an appropriate time period when the second capacitor C2 is fully charged, the voltage level on the power line POWER switches low so that ground becomes comparatively high. The opposite electrical loop (ground→the second capacitor C2→the second transistor M2→the power line POWER) makes the second capacitor C2 discharge toward the power line POWER via the second transistor M2. Similarly, one can retrieve the second signal of the target driver circuit resulted from the discharging of the second capacitor C2 during the discharge period.

After step 309, the method returns to step 301 to repeat the aforementioned steps until the first and second signals of all driver circuits are retrieved. If the first and second signals of all driver circuits are retrieved, then the method goes to step 311 to analyze the first and second signals in order to determine the functionality of every driver circuit.

Each first signal and second signal might be a charge signal, a voltage signal or a current signal. In one embodiment of the present invention, charge signals are retrieved to determine the functionality of the driver circuits. To do so, an average value of the first signals and an average value of the second signals are computed respectively. If the charge value of a first signal of a driver circuit stays within ±75% of the average of the first signals, the first transistor M1 and the first capacitor C1 of the driver circuit are determined normal because the value of the first signal depends on the functionality of the first transistor M1 and the first capacitor C1. For example, assuming that the average of the first signals is 5 pC, the range regarded as being normal is from 1.25 pC to 8.75 pC. If the first signal of a driver circuit is 3 pC, then the first transistor M1 and the first capacitor C1 of the drive circuit are considered as normal. Similarly, if the charge value of the second signal of a driver circuit stays within ±75% of the average of the second signals, the second transistor M2 of the driver circuit is determined normal.

Using the method of the present invention to test driver circuits of an AMOLED can accomplish the process precisely and efficiently, and can evade diverse test results caused by test engineers' subjective decisions.

Although there are many different frameworks of driver circuits for OLEDs, the first transistor M1, the second transistor M2 and the first capacitor C1 shown in FIG. 2 are essential and the most important elements of an OLED driver circuit. If these three elements can operate perfectly, the functionality of the driver circuit will be ensured normal. Therefore, the method of the present invention can effectively test not only the driver circuit shown in FIG. 2 but also other similar driver circuits not mentioned herein.

Figure 5:
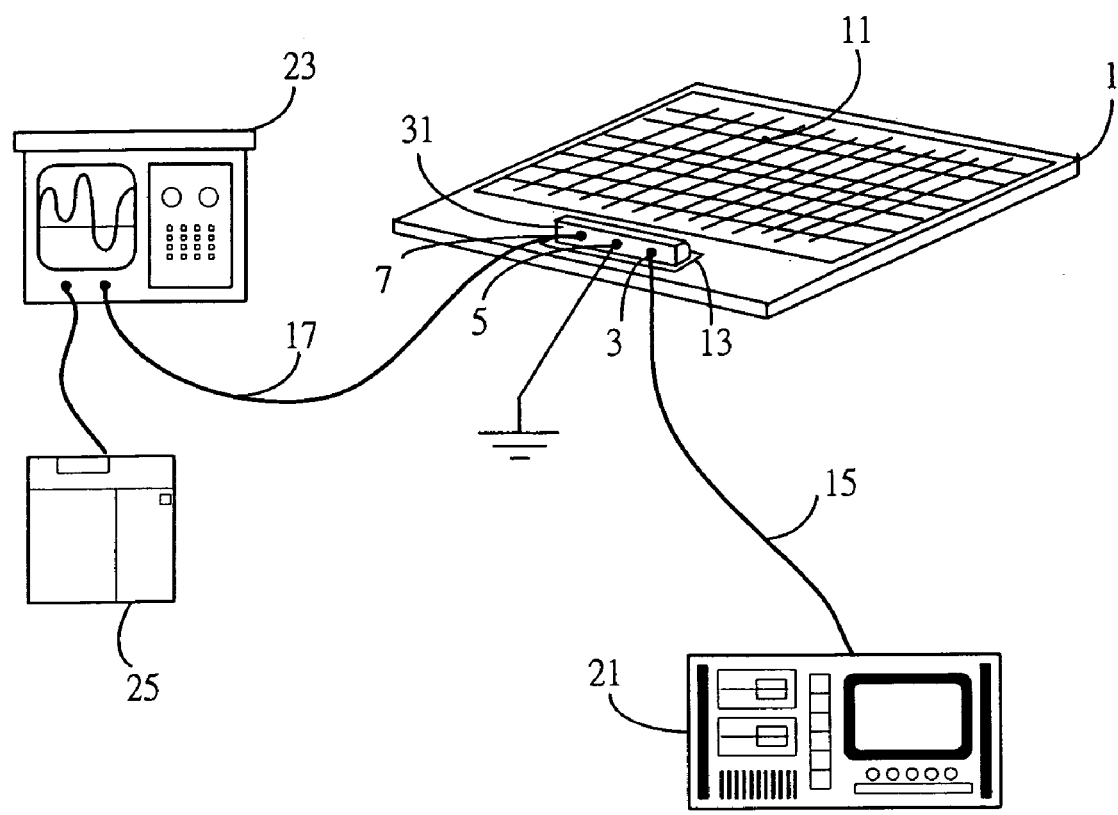
FIG. 5 illustrates an exemplary embodiment of the apparatus of the present invention during retrieving a first signal.

The present invention also discloses an apparatus configured to execute the above test method. FIG. 5 illustrates the disposal of the device for retrieving first signals by the method of the present invention. As FIG. 5 shows, an AMOLED 1 has an input panel 13 connected to the data line DL, the scan line SL and the power line POWER shown in FIG. 2. Signals are inputted or outputted via a first junction 3, a second junction 5 and a third junction 7 of a connection 31. The apparatus includes a pixel selection device 21, a signal extractor 23 and a signal analyzer 25. The pixel selection device 21, via the first junction 3, is connected to the scan line SL of the AMOLED 1. In step 303, the pixel selection device 21 inputs a signal 15 to select a target driver circuit for test. The signal extractor 23, via the third junction 7, is connected to the data line DL of the AMOLED 1. In step 305, the signal extractor 23 provides a high voltage level to charge the first capacitor C1 and retrieves a first signal 17 when the first capacitor C1 discharges. The signal analyzer 25, connected to the signal extractor 23, is configured to store all retrieved first signals and, in step 311, to analyze these signals to determine the functionality of the first transistor M1 and the first capacitor C1 of the target driver circuit. The second junction 5, connected to the power line POWER of the AMOLED 1, is preferably pulled down to ground when the first signals are retrieved.

Figure 6:
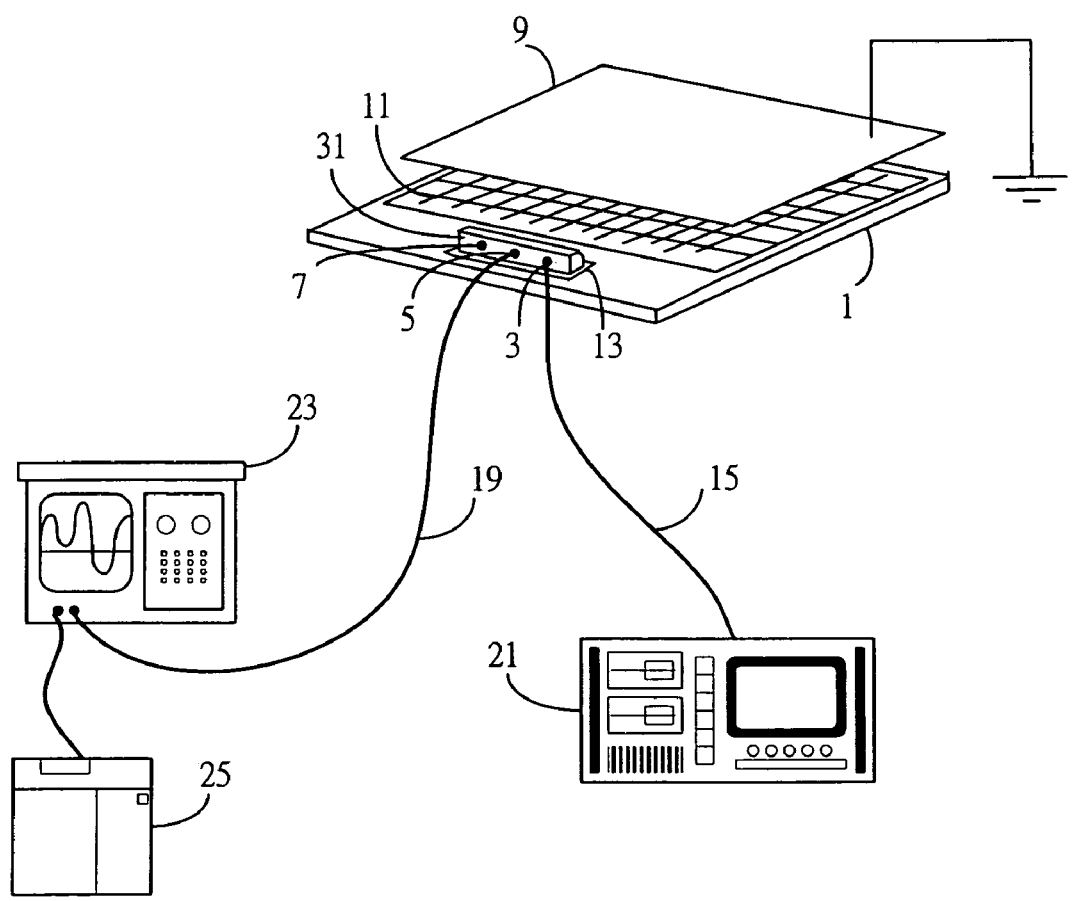
FIG. 6 illustrates an exemplary embodiment of the apparatus of the present invention during retrieving a second signal.

FIG. 6 illustrates the disposal of the device for retrieving second signals by the method of the present invention. A conductive board 9 is disposed above the array glass to form the second capacitor C2 shown in FIG. 4. The signal extractor 23, via the second junction 5, is connected to the power line POWER of the AMOLED 1. In step 309, the signal extractor 23 provides a high voltage level to charge the second capacitor C2 and retrieves a second signal 19 when the second capacitor C2 discharges. The signal analyzer 25, connected to the signal extractor 23, is configured to store all retrieved second signals and, in step 311, to analyze these signals to determine the functionality of the second transistor M2.

The above description of the preferred embodiments is expected to clearly expound the characteristics of the present invention but not expected to restrict the scope of the present invention. Those skilled in the art will readily observe that numerous modifications and alterations of the apparatus may be made while retaining the teaching of the invention. Accordingly, the above disclosure should be construed as limited only by the bounds of the claims.

The invention claimed is:

1. A method for testing a plurality of driver circuits on an array glass of an active matrix organic light emitting display (AMOLED) before organic light emitting diodes are implanted, each of the driver circuits including: a scan line, a data line, a power line, a first transistor, a second transistor and a first capacitor; the method comprising the steps of:
   (a) repeating the steps (b)~(e) until a first signal and a second signal outputted from each of the driver circuits are retrieved;
   (b) enabling one of the driver circuits via the scan line;
   (c) charging the first capacitor and retrieving the first signal from the data line when the first capacitor is discharged via the first transistor;
   (d) disposing a conductive board above the array glass to form a second capacitor between the conductive board and the array glass;
   (e) charging the second capacitor and retrieving the second signal from the power line when the second capacitor is discharged via the second transistor; and
   (f) analyzing the first and second signals to determine the functionality of said one of the driver circuits.

2. The method of claim 1, wherein the step (c) further comprises:
   (g) providing a high level voltage onto the data line to charge the first capacitor via the first transistor;
   (h) providing a low level voltage onto the data line to discharge the first capacitor via the first transistor; and
   (i) retrieving the first signal from the data line while the first capacitor is discharged.

3. The method of claim 1, wherein the step (e) further comprises:
   (j) providing a high level voltage onto the power line to charge the second capacitor via the second transistor;
   (k) providing a low level voltage onto the power line to discharge the second capacitor via the second transistor; and
   (l) retrieving the second signal from the power line while the second capacitor is discharged.

4. The method of claim 1, wherein the first and second signals are a charge signal, a voltage signal or a current signal.

5. The method of claim 1, wherein the step (f) further comprises:
   (m) respectively computing an average value of the first signals and an average value of the second signals of the driver circuits;
   (n) determining whether the value of the first signal of each of the driver circuits is within ±75% of the average value of the first signals; and
   (o) determining whether the value of the second signal of each of the driver circuits is within ±75% of the average value of the second signals;
   wherein, if the value of the first signal of the driver circuit is within ±75% of the average value of the first signals, the first transistor and the first capacitor of said one of the driver circuits has normal functionality, and if the value of the second signal of the driver circuit is within ±75% of the average value of the second signals, the second transistor of said one of the driver circuits has normal functionality.

* * * * *